United States Patent [19]
Hongo

[11] Patent Number: 6,032,221
[45] Date of Patent: Feb. 29, 2000

[54] FLASH MEMORY EMBEDDED MICROCOMPUTER

[75] Inventor: Katsunobu Hongo, Tokyo, Japan

[73] Assignee: Mitsubishi Denki Kabushiki Kaisha, Tokyo, Japan

[21] Appl. No.: 09/019,040

[22] Filed: Feb. 5, 1998

[30] Foreign Application Priority Data

Oct. 24, 1997 [JP] Japan .................................. 9-292990

[51] Int. Cl.$^7$ .................................................. G06F 15/78
[52] U.S. Cl. ..................... 711/103; 714/721; 365/185.33; 712/37
[58] Field of Search ........................... 365/185.29, 185.3, 365/185.33, 218; 711/103; 712/37, 43; 714/721, 733, 22, 30, 42

[56] References Cited

U.S. PATENT DOCUMENTS

| | | | |
|---|---|---|---|
| 4,382,279 | 5/1983 | Ugon | 712/37 |
| 5,153,853 | 10/1992 | Eby et al. | 365/185 |
| 5,909,397 | 6/1999 | San et al. | 365/185.24 |

FOREIGN PATENT DOCUMENTS 5-325580  12/1993  Japan .

*Primary Examiner*—John W. Cabeca
*Assistant Examiner*—Denise Tran
*Attorney, Agent, or Firm*—Burns, Doane, Swecker & Mathis, LLP

[57] ABSTRACT

A flash memory capable of solving a problem of a conventional flash memory in that it requires considerable time and effort to measure supply voltages generated in the flash memory during writing, erasing and verifying operations, and is difficult to acquire accurate results, because they cannot be measured by a tester and must be measured manually by putting a probe directly to voltage supply lines. The present flash memory includes a first voltage transfer circuit for supplying an A/D converter with an analog signal input to a microcomputer, and a second voltage transfer circuit for supplying the input terminal of the A/D converter with a programming voltage generated by a flash memory voltage generator, and brings the first voltage transfer circuit into a conducting state and the second voltage transfer circuit into a nonconducting state in a normal operation mode, and brings the first voltage transfer circuit into the nonconducting state and the second voltage transfer circuit into the conducting state in a voltage measurement mode to measure voltages on the flash memory power supply lines.

15 Claims, 13 Drawing Sheets

FIG.2

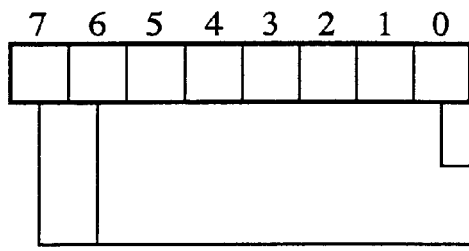

BITS 7 6 5 4 3 2 1 0

FLASH CONTROL REGISTER 21

CPU REWRITE MODE SELECT BIT

MEASURED VOLTAGE SELECT BITS
00 : SELECT NONE OF VOLTAGES
   ( ALL TRANSMISSION GATES
   50,51 AND 52 ARE OFF )
01 : SELECT VAMP
   (ONLY TRANSMISSION GATE
   50 IS ON )
10 : SELECT VDEC
   (ONLY TRANSMISSION GATE
   51 IS ON )
11 : SELECT VDEC2
   (ONLY TRANSMISSION GATE
   52 IS ON )

FIG.6

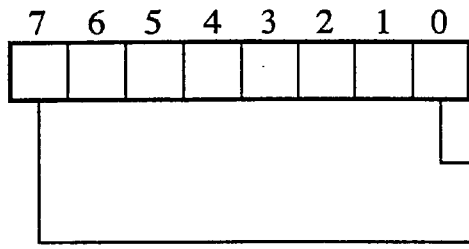

BITS 7 6 5 4 3 2 1 0

FLASH CONTROL REGISTER 21

CPU REWRITE MODE SELECT BIT

VOLTAGE MEASUREMENT MODE SELECT BIT

| SUPPLY VOLT-AGES / OPERATION MODES | VDEC | VDEC2 | VAMP | VMD | VMS |
|---|---|---|---|---|---|
| PROGRAMMING | 12.0V | 5.0V | 5.0V | 12.0V | 0V |
| READ | 5.0V | 5.0V | 5.0V | 5.0V | 0V |
| PROGRAM VERIFICATION | 6.3V | 5.0V | 5.5V | 5.0V | 0V |
| ERASURE VERIFICATION | 3.5V | 3.5V | 4.0V | 5.0V | 0V |
| ERASURE | 5.0V | 5.0V | 5.0V | 5.0V | 12.0V |

FLASH MEMORY EMBEDDED MICROCOMPUTER

BACKGROUND OF THE INVENTION

1. Field of the Invention

The present invention relates to a flash memory embedded microcomputer (simply called microcomputer from now on), and particularly to a microcomputer that carries out erasing and writing control of the flash memory using a central processing unit (called CPU below).

2. Description of Related Art

Conventionally, methods of erasing and programming a flash memory embedded in a microcomputer are roughly divided into an external programming mode that rewrites it using an external flash writer with halting its CPU, and a CPU programming mode that rewrites its contents using an embedded CPU.

FIG. 13 is a block diagram showing a configuration of a conventional flash memory embedded microcomputer with the CPU programming mode. In FIG. 13, the reference numeral 1 designates a microcomputer; 2 designates a CPU; 3 designates a flash memory section; 4 designates a RAM; 5 designate an A/D converter; 6 designates peripheral devices such as a timer, serial I/O, D/A converter, monitor timer, etc.; 7 designates an input/output port controller; and 8 designates a data bus interconnecting the CPU 2, flash memory section 3, RAM 4, A/D converter 5, peripheral devices 6, and input/output port controller 7.

The flash memory section 3 comprises a flash memory cell array 10, an address decoder 11, a sense amplifier/write circuit 12, a source circuit 13, a flash supply voltage generator 17 and a flash memory controller 18. The flash memory controller 18 includes a sequence circuit 20, a flash control register 21, a flash command register 22 and a command decoder 23, and is connected with the sense amplifier/write circuit 12 and flash supply voltage generator 17 through control lines 31 and 32.

The flash supply voltage generator 17 generates voltages to be supplied to power supply lines 35, 36 and 37 using supply voltages $V_{pp}$, $V_{cc}$ and $V_{ss}$ which are externally fed through power supply ports 60, 61 and 62, and these voltages are supplied to the sense amplifier/write circuit 12, address decoder 11 and source circuit 13 through the power supply lines 35, 36 and 37.

The reference numerals 80, 81 and 8n each designate a transmission gate that selects an analog voltage from those input through input ports 70, 71 and 7n, and supplies it to an input terminal $AN_{IN}$ of the A/D converter 5; and 67 designates an external trigger $AD_{TRG}$ input port for inputting an external trigger signal that triggers the A/D converter 5 to start its conversion.

FIG. 14 is a circuit diagram showing the structure of one of the transmission gates 80, 81 and 8n in FIG. 13, in which a transmission gate 200 represented by a rhombus consists of an N-channel transistor 201 and a P-channel transistor 202.

Next, the operation in the CPU rewrite mode will be described.

a) The CPU 2 transfers a CPU rewrite control program (called boot program below) stored in the flash memory cell array 10 to the RAM 4 through the data bus 8.

b) The CPU 2 jumps to the boot program in the RAM 4 to execute the following processings using the boot program.

c) The CPU 2 writes "1" into the "CPU rewrite mode select bit" in the flash control register 21, thereby selecting this mode.

d) The flash supply voltage generator 17 is supplied with the high voltage $V_{pp}$ (12.0 V) that is used for writing and erasing the flash memory from the outside of the microcomputer 1, thereby enabling the generation of the flash memory supply voltages.

e) The CPU 2 writes commands to the flash command register 22.

f) Decoding the commands written in the flash command register 22, the command decoder 23 instructs the sequence circuit 20 which command to be executed.

g) The sequence circuit 20 carries out the sequence corresponding to the command, and causes the flash supply voltage generator 17, address decoder 11 and sense amplifier/write circuit 12 to operate at correct timings through the control lines 31 and 32.

h) The flash supply voltage generator 17 generates and supplies the power supply lines 35, 36 and 37 with voltages of required levels at required timings to feed them to the sense amplifier/write circuit 12, address decoder 11 and source circuit 13.

The commands includes the following, for example.

Read command: Read the contents of the flash memory.

Programming command: Write data into the flash memory.

Program verification command: Read the contents of the flash memory to verify whether the data are written correctly after write operation.

Erasing command: Erase the contents of the flash memory.

Erasure verification command: Read the contents of the flash memory to verify whether the data are erased after erasing operation.

Fig. 15 is a table illustrating levels of the supply voltages output from the flash supply voltage generator 17 during the execution of the commands.

FIG. 16 is a block diagram showing a 1-bit memory cell and its associated portions in the flash memory cell array 10, address decoder 11, sense amplifier/write circuit 12 and source circuit 13 connected to the cell to explain the operation during the execution of the commands.

In FIG. 16, the reference numeral 127 designates a 1-bit memory cell; 130 and 131 designate an address decoder circuit and a word line buffer in the address decoder 11, respectively, which are driven by the supply voltages VDEC2 and VDEC on the power supply line 36 in FIG. 13.

The reference numerals 121, 122 and 123 designate a sense amplifier, a write circuit and a bit line selector in the sense amplifier/write circuit 12, in which the sense amplifier 121 and write circuit 122 are driven by the supply voltages VAMP and VMD, respectively. The reference numeral 133 designate a source circuit driven by the supply voltage VMS, 135 designates a word line, and 136 designates a bit line.

Next, the operation of the circuit of FIG. 16 will be described in terms of the operation modes started by the commands.

(1) Read operation mode:

As shown in FIG. 15, all the voltages are set at 5.0 V so that the word line 135 is placed at 5 V, that is, at an "H" level. Sensing the potential of the bit line 136, the sense amplifier 121 detects whether the memory cell 127 promote current (data "1") or hinders it (data "0"), and supplies the data stored in the memory cell 127 to the data bus 8.

(2) Write (programming) operation mode:

Since the supply voltage VDEC to the word line buffer 131 is set at 12 V, the word line 135 connected to the gate of the memory cell 127 is also placed at 12 V. In addition, since the supply voltage VMD is also 12 V, the bit line 136 connected to the drain is placed at about 7 V. The supply voltage VMS for the source circuit 133 is set at 0 V. In this state, data "O" is written because a large current flowing through the drain and source of the memory cell 127 induces hot electrons that are injected into its floating gate 128, which brings about the state that hinders the current.

(3) Erasing operation mode:

The supply voltage VMS for the source circuit 133 is set 12.0 V, the word line 135 is placed at 0 V or an "L" level by the address decoder circuit 130, and the bit line 136 is interrupted by a selector 123. In this state, the erasure is carried out because the electrons are drawn out of the floating gate 128 by the tunnel effect. As a result, data "1" is written that promotes the current flow.

(4) Program verification mode:

The word line 135 is placed at 6.3 V by setting VDEC at 6.3 V. On the other hand, the sense amplifier 121 operates at 5.5 V because VAMP is placed at 5.5 V. In this state, the memory cell 127 promotes current flow as compared in the read mode. In other words, the data is apt to be read as "1" or erased. Accordingly, if data "0" is not deeply written into the memory cell 127, it is not identified as "0" or written. If the data is identified as "1", the program command is executed again to iterate this operation until it is finally identified as "0" by the program verification.

(5) Erasure verification mode:

The supply voltages VDEC and VDEC2 are set at 3.5 V so that the word line 135 is placed at 3.5 V, and VAMP is placed at 4.0 V so that the sense amplifier 121 is driven at 4.0 V. In this state, the data is apt to be read as "0"(written), which is converse to the program verification mode. In other words, if the data "1" is not sufficiently erased, it is not decided as "1" (erased). The erasure verification is repeated until it is finally identified as "1" or erased.

Thus, the voltage levels of VDEC, VDEC2 and VAMP are set at intermediate potentials in the program verification mode and erasure verification mode. This enables the write level or erased depth of the memory cell 127, that is, the quantity of electrons in the floating gate or the ease of the current flow, to be controlled, that is, to be written or erased to a particular depth.

Since the write or erasure depth of the memory cell greatly depends on these voltages, the voltage level control has a critical importance in determining the characteristics of the flash memory. If the voltages shift from the design values, various problems will occur. For example, when too much writing remains undone, the draw of a small amount of electrons from the floating gate will result in the data loss which means that data "0" cannot be read, or on the contrary if the writing is too deep, the data cannot be erased easily. Similar phenomena will appear with the depth of erasure.

It is difficult, however, to adjust the flash supply voltage generator 17 because the voltage levels can be altered owing to the changes in wafer process or lines, or fluctuations in product parameters. Accordingly, it is necessary to measure the voltage levels every time a new product is developed, wafer process or line is changed, or a trouble occurs.

With such an arrangement, the conventional flash memory embedded microcomputer provides no means for measuring the voltages VAMP, VDEC, VDEC2, etc. from the outside of the chip so that they are measured directly by putting a probe on wiring on the chip. This, however, presents problems of requiring not only time and effort for fabricating a sample without a protective film or removing the protective film, but also a professional skill to put a probe on wiring of a few to one micrometer wide and a dedicated measuring instrument.

Furthermore, since the levels of these supply voltages cannot be measured in a normal wafer test, they are not measured again once they have been measured by putting the probe on the wiring, and the circuit and product parameters have been adjusted accordingly, except when significant alternation is carried out. Although the fluctuations in the voltage levels do not directly cause troubles of the product because the flash supply voltage generator 17 is designed such that it is invulnerable to various fluctuations and has a sufficient operation margin, it has a problem in that voltage level fluctuations cannot be detected which are due to variations in the product parameters, device troubles, or minute foreign substances.

In view of this, Japanese patent application laid-open Nos. 5-325580/1993 and 8-16747/1995 disclose techniques for measuring the supply voltage levels of a flash memory with an A/D converter. However, they have a complicated and expensive configuration because they have a dedicated A/D converter for measuring the voltage levels. In addition, it is not easy to read out their A/D converted results because they do not use an embedded CPU but directly write the results into registers to be read, or convert the digital data that have been once stored to analog values to be output.

SUMMARY OF THE INVENTION

The present invention is implemented to solve the foregoing problems. It is therefore an object of the present invention to provide a flash memory embedded microcomputer capable of enabling the supply voltages, which are generated in the flash memory for controlling it, to be measured with a common tester or a simple estimation instrument.

Another object of the present invention is to provide a flash memory embedded microcomputer capable of feeding information on voltage fluctuations back to wafer process, or of achieving prompt rejection of defective chips whose voltages substantially deviated owing to foreign substances or the like.

According to one aspect of the present invention, there is provided a flash memory embedded microcomputer comprising: a flash memory; a flash supply voltage generator provided in the flash memory for generating supply voltages of the flash memory; flash memory power supply lines provided in the flash memory for conveying the supply voltages; an A/D converter for converting an input signal to the microcomputer into a digital signal; first voltage transfer means for interruptibly connecting one or more input ports of the microcomputer to an analog input terminal of the A/D converter; second voltage transfer means for interruptibly connecting each of the flash memory power supply lines to the analog input terminal of the A/D converter; and a CPU for bringing the first voltage transfer means into a conducting state and the second voltage transfer means into a nonconducting state in a normal operation mode, for bringing the first voltage transfer means into the nonconducting state and the second voltage transfer means into the conducting state in a voltage measurement mode of measuring voltages on the flash memory power supply lines, and for controlling reading of a conversion result of the A/D converter.

Here, the second voltage transfer means may have its output terminals commonly connected to an input terminal of the first voltage transfer means.

The flash memory embedded microcomputer may further comprise third voltage transfer means, provided in a vicinity of the first voltage transfer means, for interruptibly connecting output terminals of the second voltage transfer means in common to an input terminal of the first voltage transfer means.

The flash memory embedded microcomputer may further comprise third voltage transfer means, provided in a vicinity of the first voltage transfer means, for interruptibly connecting output terminals of the second voltage transfer means in common to the input terminal of the A/D converter.

The flash memory embedded microcomputer may further comprise dedicated transmission lines for connecting each of output terminals of the second voltage transfer means to one of input terminals of the first voltage transfer means.

The second voltage transfer means may be provided in a vicinity of the first voltage transfer means.

The second voltage transfer means may comprise one or more voltage dividers for stepping down one or more voltages on the flash memory power supply lines.

The flash memory embedded microcomputer may further comprise a selector for selecting one of trigger signals of the A/D converter fed from an external trigger input port and from a sequence circuit of a flash memory controller of the flash memory, wherein the selector may select the trigger signal fed from the external trigger input port in the normal mode, and the trigger signal fed from the sequence circuit in the voltage measurement mode, and may supply the selected trigger signal to the A/D converter.

The flash memory may comprise a flash control register in a flash memory controller, and the flash control register may include generated voltage select bits for selecting a voltage to be generated by the flash supply voltage generator.

The flash memory embedded microcomputer may further comprise at least one pair of lines selected from a group consisting of a pair of ground lines and a pair of power supply lines, and the pair of lines may be disposed at both sides of a line for supplying each output of the second voltage transfer means to the input terminal of the A/D converter.

The flash memory embedded microcomputer may further comprise fourth voltage transfer means connected in series between the flash memory power supply lines and the second voltage transfer means for supplying the flash memory with voltages at connecting points of the second voltage transfer means and the fourth voltage transfer means.

BRIEF DESCRIPTION OF THE DRAWINGS

FIG. 2 is a diagram showing a structure of a flash control register in the embodiment 1;

FIG. 6 is a diagram showing a structure of a flash control register in the embodiment 4;

DETAILED DESCRIPTION OF THE PREFERRED EMBODIMENTS

The invention will now be described with reference to the accompanying drawings.

Embodiment 1

Figure 1:
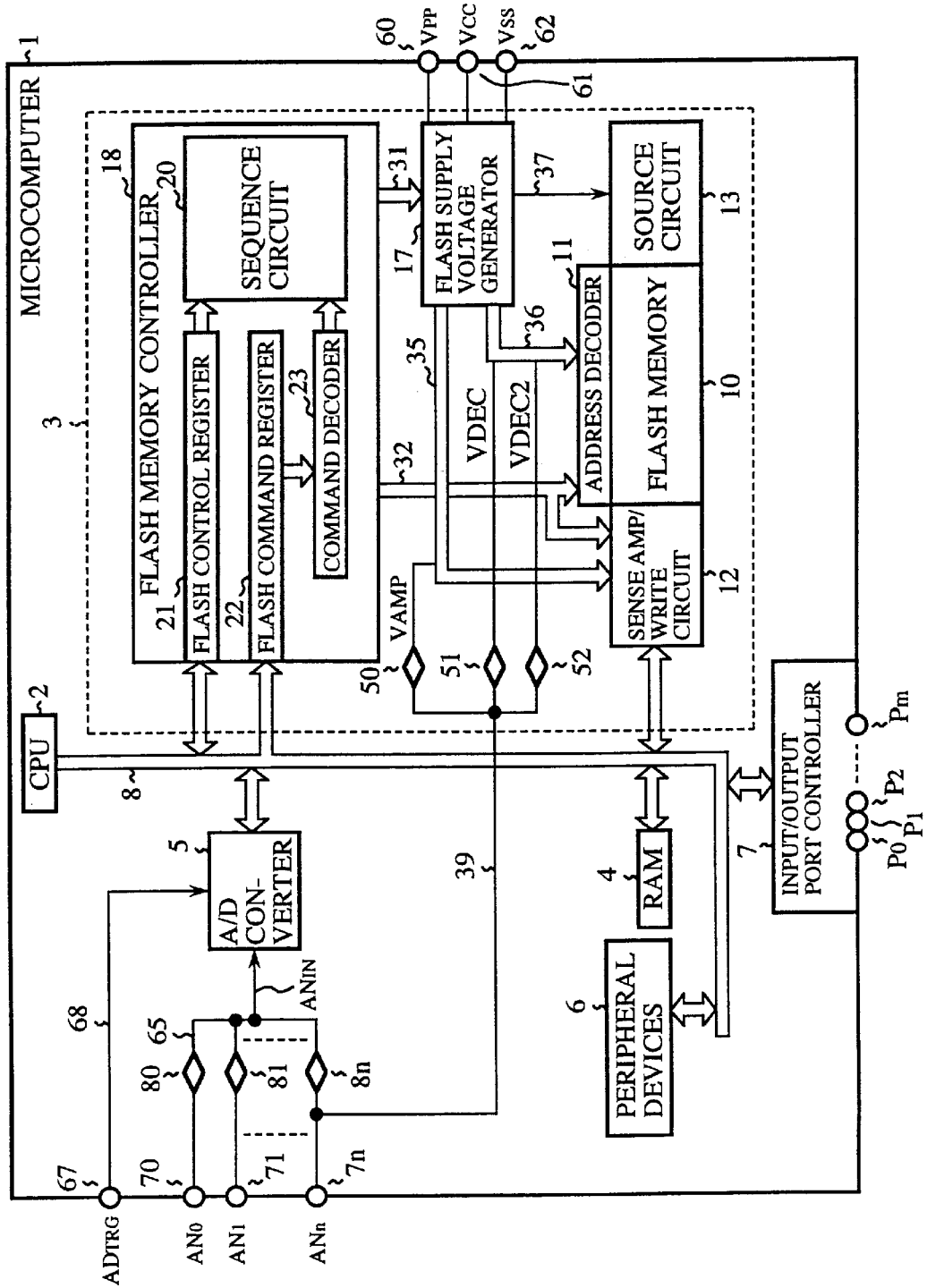
FIG. 1 is a block diagram showing a configuration of an embodiment 1 of a flash memory embedded microcomputer in accordance with the present invention.

FIG. 1 is a block diagram showing a configuration of an embodiment 1 of a flash memory embedded microcomputer in accordance with the present invention. In FIG. 1, the reference numeral 1 designates a microcomputer; 2 designates a CPU; 3 designates a flash memory section (flash memory); 4 designates a RAM; 5 designate an A/D converter; 6 designates peripheral devices such as a timer, serial I/O, D/A converter, monitor timer, etc.; 7 designates an input/output port controller; and 8 designates a data bus interconnecting the CPU 2, flash memory section 3, RAM 4, A/D converter 5, peripheral devices 6 and input/output port controller 7.

The flash memory section 3 comprises a flash memory cell array 10, an address decoder 11, a sense amplifier/write circuit 12, a source circuit 13, a flash supply voltage generator 17 and a flash memory controller 18. The flash memory controller 18 includes a sequence circuit 20, a flash control register 21, a flash command register 22 and a command decoder 23, and is connected with the sense amplifier/write circuit 12 and flash supply voltage generator 17 through control lines 31 and 32.

The flash supply voltage generator 17 generates voltages to be supplied to power supply lines 35, 36 and 37 using supply voltages $V_{pp}$, $V_{cc}$ and $V_{ss}$, which are externally fed through power supply ports 60, 61 and 62, and these voltages are supplied to the sense amplifier/write circuit 12, address decoder 11 and source circuit 13 through the power supply lines 35, 36 and 37.

The reference numerals 80, 81 and 8n each designate a transmission gate as an interruptible first voltage transfer means that selects an analog voltage from among the voltages input through input ports 70, 71 and 7n, and supplies it to an input terminal $AN_{IN}$ of the A/D converter 5; and 67 designates an external trigger $AD_{TRG}$ input port for inputting an external trigger signal that triggers the A/D converter 5 to start its conversion.

The reference numerals 50, 51 and 52 each designate a transmission gate as an interruptible second voltage transfer means connected to the power supply lines 35, 36 and 37 for measuring the voltages VAMP, VDEC and VDEC2, respectively. They are connected to the input port 7*n* (AN*n*) through a line 39. The flash control register 21 has additional select bits (measured voltage select bits) for selecting ON/OFF of the transmission gates 50, 51 and 52 as shown in FIG. 2.

Although a concrete structure for the control is not shown in the drawings, the transmission gates 80, 81 and 8*n* and transmission gates 50, 51 and 52 are controlled by the CPU 2 through an address decoder in the A/D converter 5 and an address decoder in the flash memory section 3, respectively.

Next, the operation of the present embodiment 1 will be described.

Since the normal erasure and write operation of the flash memory is the same as those of the foregoing conventional device, the description thereof is omitted. The following describes measuring procedures of the voltages VAMP, VDEC and VDEC2 in the present embodiment 1. For example, in measuring the voltages VAMP, VDEC and VDEC2 in the erasure verification operation, the following procedures a)–d) are the same as those in the conventional system.

a) The transfer of the boot program to the RAM 4.
b) The jump to the boot program in the RAM 4.
c) The selection of the CPU rewrite mode.
d) The application of the high voltage $V_{pp}$.

Afterward, the following steps are taken.

e) The CPU 2 writes an erasure verification command to the flash command register 22.
f) Decoding the command written in the flash command register 22, the command decoder 23 provides the sequence circuit 20 with the decoded results.
g) The sequence circuit 20 supplies the flash supply voltage generator 17 with a signal that causes the flash supply voltage generator 17 to generate the potentials corresponding to the erasure verification command.
h) The flash supply voltage generator 17 generates the erasure verification voltages and supplies them to the sense amplifier/write circuit 12 and address decoder 11.
i) The CPU 2 writes a code (for example, a code instructing the measurement of the voltage VAMP) in the "measurement voltage select bits" in the flash control register 21. The bits have been automatically set at their default values that places all the transmission gates 50, 51 and 52 in the OFF state, and have been kept at these values until the code is written.
j) The transmission gate 50 is turned on so that the voltage level of the VAMP (=4.0 V in this case) is transferred through the wiring 39 to the input terminal of the transmission gate 8*n* at the previous stage of the A/D converter 5, that is, to the input port 7*n*.
k) Waiting for the level of the voltage VAMP to be settled, the CPU 2 activates the A/D converter 5 to convert the analog potential fed from the input port 7*n* to the corresponding digital potential.
l) Carrying out the A/D conversion, the A/D converter 5 writes the converted result (digital value) into an internal A/D conversion result register, and requests to the CPU 2 an A/D conversion end interrupt.
m) Receiving the interrupt request, the CPU 2 reads out the content of the A/D conversion result register.
n) The CPU 2 outputs the result to ports PO-P*m* through the input/output port controller 7. Alternatively, the resultant data can be output to an external data bus under the control of the CPU 2 in a mode that uses the external data bus.
o) The VAMP voltage level can be obtained by reading out the state of the ports PO–P*m* such as "11011011" in a test using a tester, or in an estimation using an estimation instrument (board).

The voltage levels can be measured in the same manner in the program verification or read mode by only changing the command written in the foregoing item (e).

Although the embedded A/D converter 5 is used in the foregoing k)–o) for measuring the VAMP voltage level, it is also possible to directly measure the VAMP voltage level output from the transmission gate 8*n*.

As describe above, the present embodiment 1 has an advantage of facilitating the measurement of the voltage levels such as VAMP by a minor circuit change of providing the transmission gates 50, 51 and 52 between the input port 7*n* and the supply voltages VAMP and so forth, which measurement requires a lot of time and effort in the conventional system. Furthermore, since the measurement of the present embodiment 1 can be easily carried out with a tester, it offer an advantage of facilitating feedback to the wafer process steps or rejection of defective chips.

Embodiment 2

Figure 3:
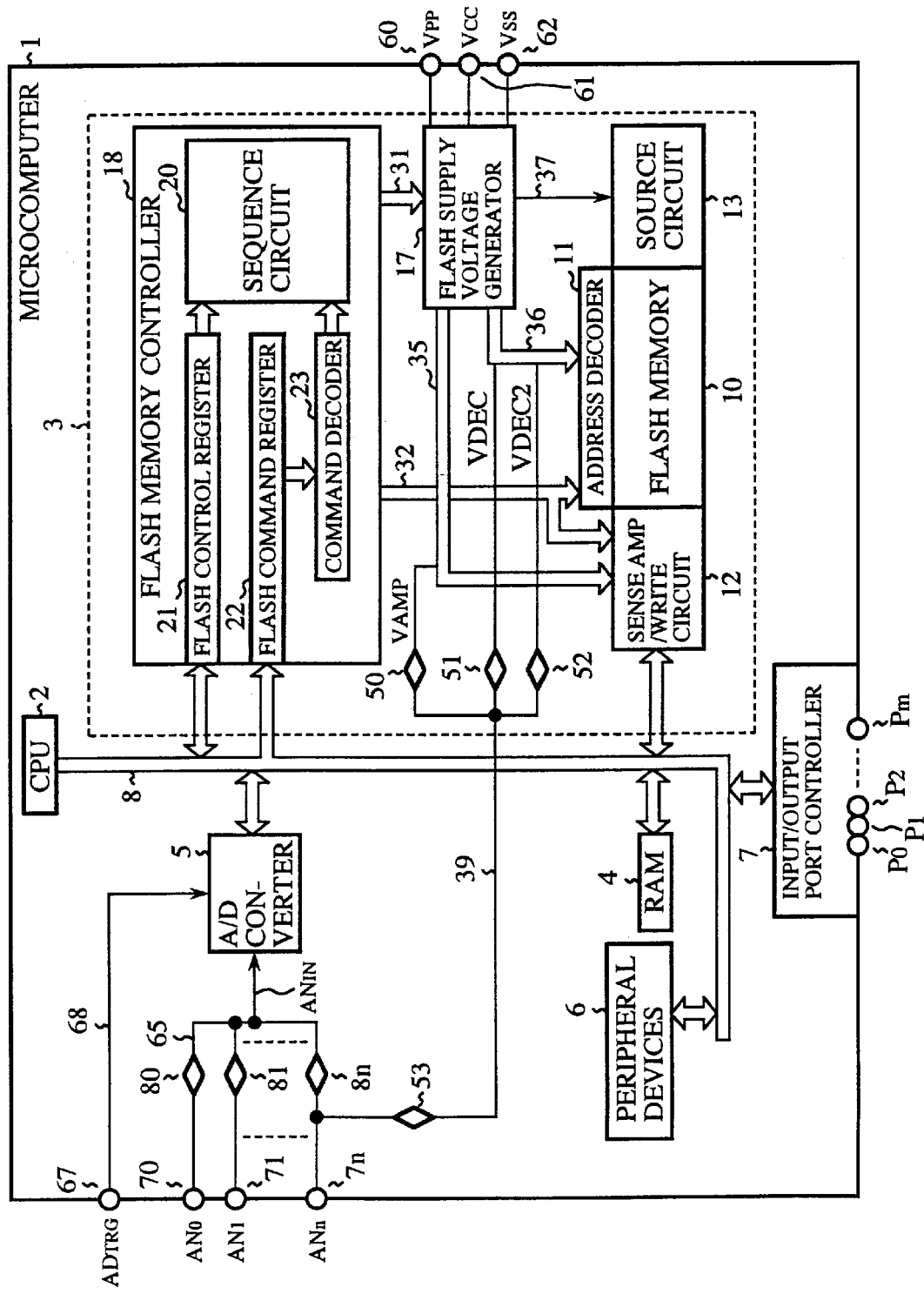
FIG. 3 is a block diagram showing a configuration of an embodiment 2 of the flash memory embedded microcomputer in accordance with the present invention.

FIG. 3 is a block diagram showing a configuration of an embodiment 2 of the flash memory embedded microcomputer in accordance with the present invention. The embodiment 2 comprises, in the vicinity of the transmission gate 8*n*, a transmission gate 53 as an interruptible third voltage transfer means that conducts when at least one of the transmission gates 50, 51 and 52 conducts. The transmission gate 53 is controlled by the CPU 2. Since the remaining configuration is the same as that of the foregoing embodiment 1, description thereof is omitted here to avoid duplication by designating like portions by the same reference numerals.

According to the embodiment 2, the transmission gate 53, which is provided adjacently to the input port 7*n* and transmission gate 8*n*, can cut off the effect of the noise in the chip possibly conveyed through the long wiring 39. As a result the present embodiment 2 offers an advantage of preventing degradation in accuracy of the A/D conversion of an ordinary analog signal A*nn* applied to the input port 7*n*.

Embodiment 3

Figure 4:
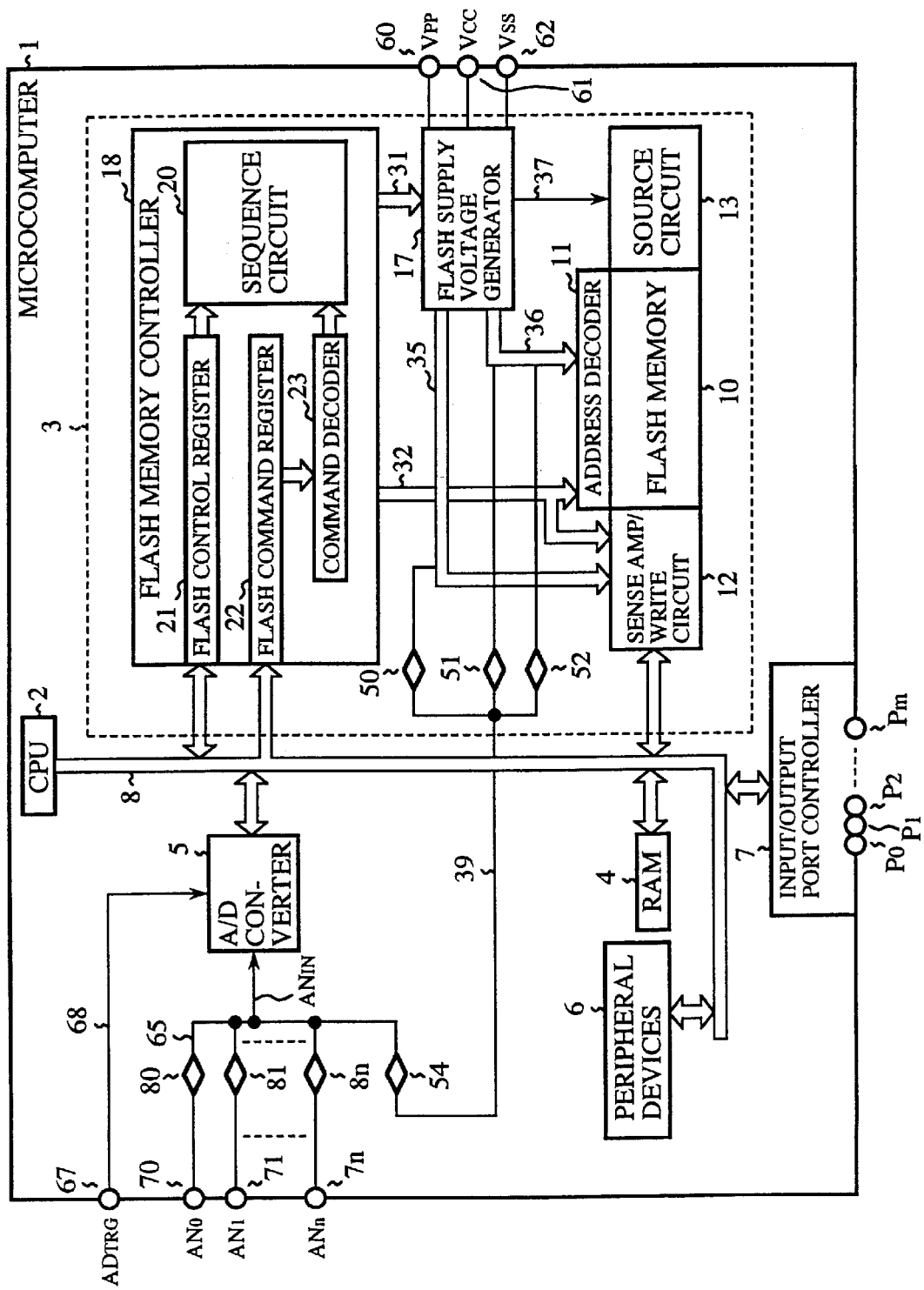
FIG. 4 is a block diagram showing a configuration of an embodiment 3 of the flash memory embedded microcomputer in accordance with the present invention.

FIG. 4 is a block diagram showing a configuration of an embodiment 3 of the flash memory embedded microcomputer in accordance with the present invention. The embodiment 3 comprises a transmission gate 54 as a third voltage transfer means that conducts when at least one of the transmission gates 50, 51 and 52 conducts. The transmission gate 54 is connected to the output terminals of the transmission gates 80, 81 and 8*n* which are controlled by the CPU 2 such that they are all turned off whenever the transmission gate 54 conducts. Since the remaining configuration is the same as that of the foregoing embodiment 1, description thereof is omitted here to avoid duplication by designating like portions by the same reference numerals.

Thus, the present embodiment 3 offers an advantage of preventing degradation in accuracy of the ordinary A/D conversion as the embodiment 2. In addition, although the voltages to be measured such as the voltage VAMP must pass through three stages consisting of the transmission gates 50, 53 and 8*n*, and so forth, in the foregoing embodiment 2, they pass through only two stages such as the transmission gates 50 and 54 in the present embodiment 3. Accordingly, they can be measured at higher accuracy, although they cannot be measured directly at the input port 7*n* (A*nn*).

Embodiment 4

Figure 5:
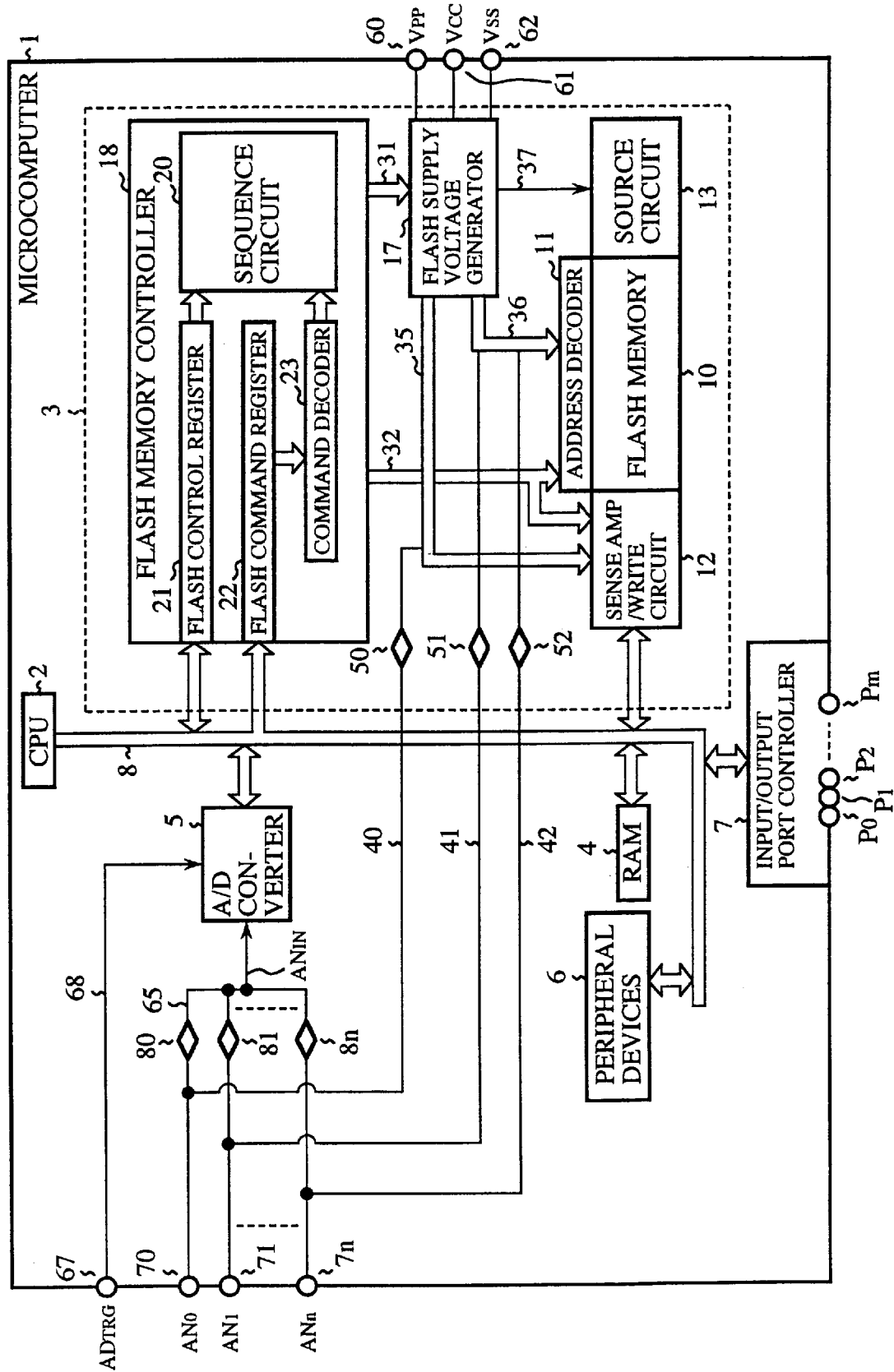
FIG. 5 is a block diagram showing a configuration of an embodiment 4 of the flash memory embedded microcomputer in accordance with the present invention.

FIG. 5 is a block diagram showing a configuration of an embodiment 4 of the flash memory embedded microcomputer in accordance with the present invention. In FIG. 5, the reference numerals 40, 41 and 42 designate signal lines for transferring outputs of the transmission gates 50, 51 and 52 to the transmission gates 80, 81 and 8n, respectively. Since the remaining configuration is the same as that of the foregoing embodiment 1, description thereof is omitted here to avoid duplication by designating like portions by the same reference numerals.

FIG. 6 is a diagram showing a structure of a flash control register 21, one of the components of the present embodiment 4 of the flash memory embedded microcomputer. It comprises a "voltage measurement mode select bit" instead of the "measured voltage select bits" of the flash control register 21 in the embodiment 1. Writing "1" into the "voltage measurement mode select bit" brings all the transmission gates 50, 51 and 52 into conduction.

By sequentially measuring the inputs from the transmission gates 80, 81 and 8n with placing the A/D converter 5 in operation, the voltages VAMP, VDEC and VDEC 2 are measured successively, in which case the A/D conversion of the inputs cannot be accomplished in parallel but one by one.

Thus, the present embodiment 4 can offer an advantage, in addition to that of the embodiment 1, that the plurality of voltages can be measured collectively. The transmission gates 50, 51 and 52 can be disposed in the vicinity of the transmission gates 80, 81 and 8n, in which case the noise effect in the chip can be restricted as in the embodiment 2.

Embodiment 5

Figure 7:
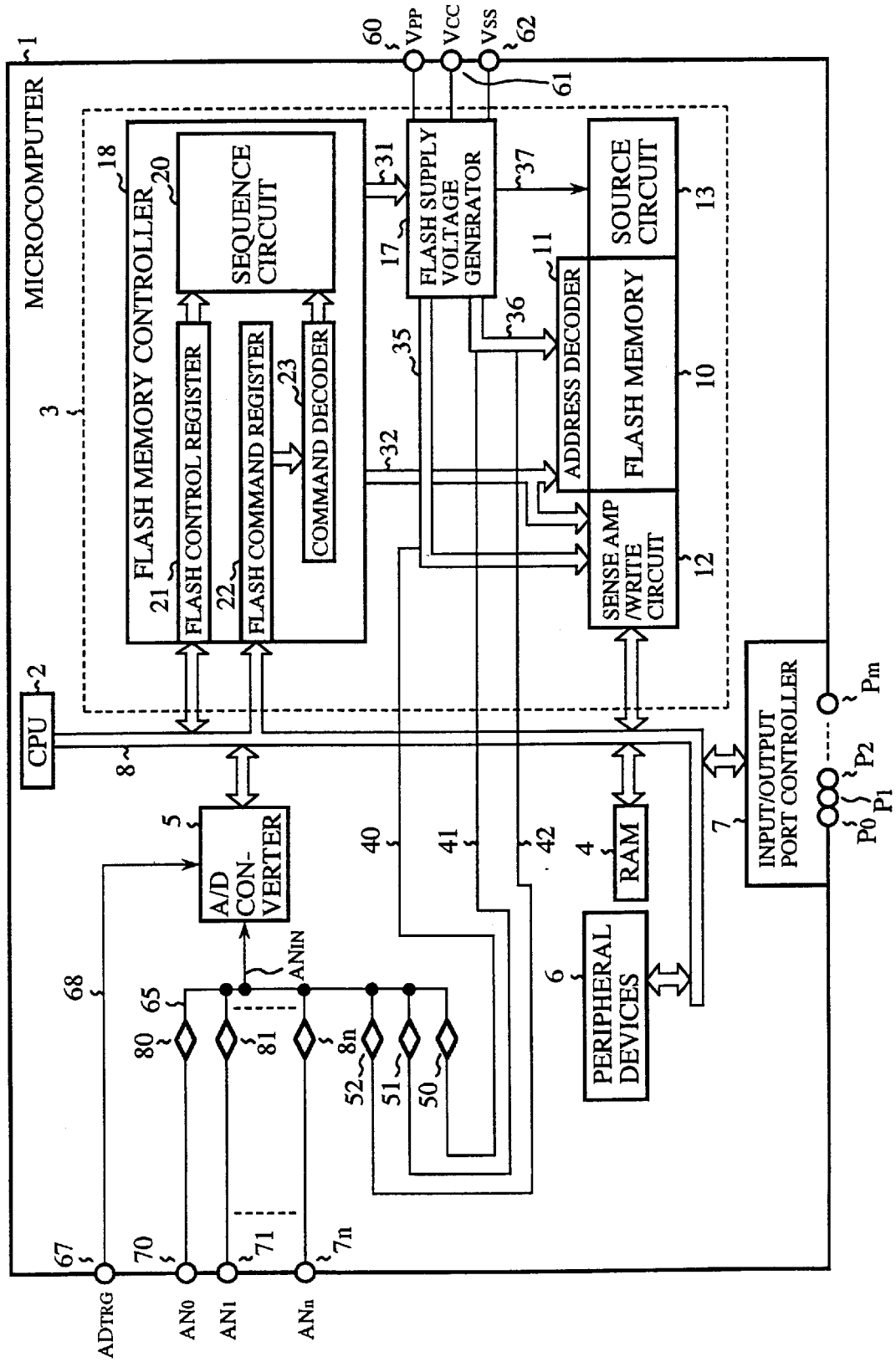
FIG. 7 is a block diagram showing a configuration of an embodiment 5 of the flash memory embedded microcomputer in accordance with the present invention.

FIG. 7 is a block diagram showing a configuration of an embodiment 5 of the flash memory embedded microcomputer in accordance with the present invention. In FIG. 7, the transmission gates 50, 51 and 52 are disposed in parallel with the transmission gates 80, 81 and 8n, and their outputs are collectively connected to the input terminal $AN_{IN}$ of the A/D converter 5. In addition, with selecting the "measured voltage select bits" of the flash control register 21 as shown in FIG. 2, one of the transmission gates 50, 51 and 52 corresponding to the selection conducts, and all the transmission gates 80, 81 and 8n are turned OFF. Since the remaining configuration is the same as that of the foregoing embodiment 1, description thereof is omitted here to avoid duplication by designating like portions by the same reference numerals.

According to the present embodiment 5, since each voltage to be measured is input to the A/D converter 5 through only one stage consisting of one of the transmission gates 50, 51 and 52, it has an advantage of improving the accuracy of the A/D conversion. Besides, since the transmission gates 80, 81 and 8n are completely separated from the transmission gates 50, 51 and 52, the present embodiment 5 has an advantage that the ordinary A/D conversion of the analog inputs to the input ports 70, 71 and 7n has stronger resistance to the internal noise.

Embodiment 6

Figures 14, 15:
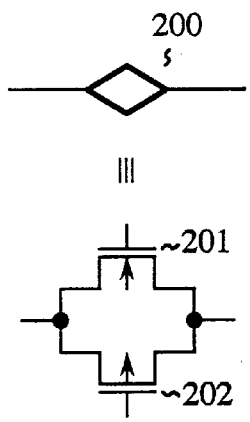
FIG. 14 is a circuit diagram showing a structure of a transmission gate.
FIG. 15 is a table showing correspondence between commands and supply voltages.

In a common microcomputer, the A/D converter 5 and transmission gates 80, 81 and 8n are designed such that they measure and transfer a voltage in a range from $V_{ss}$ (=0 V) to $V_{cc}$ (=5.0 V). Accordingly, it cannot measure such voltages as VDEC (=6.3 V) and VAMP (=5.5 V) in the program verification mode of FIG. 15, unless it is redesigned to handle voltages exceeding $V_{cc}$ (=5.0 V).

To avoid this and make effective use of the A/D converter 5 and peripheral devices 6 commonly employed by the microcomputer 1, the voltages to be measured must be linearly dropped below 5.0 V before they are output from the flash memory section 3. For example, 6.3 V is halved to 3.15 V.

Figure 8A:
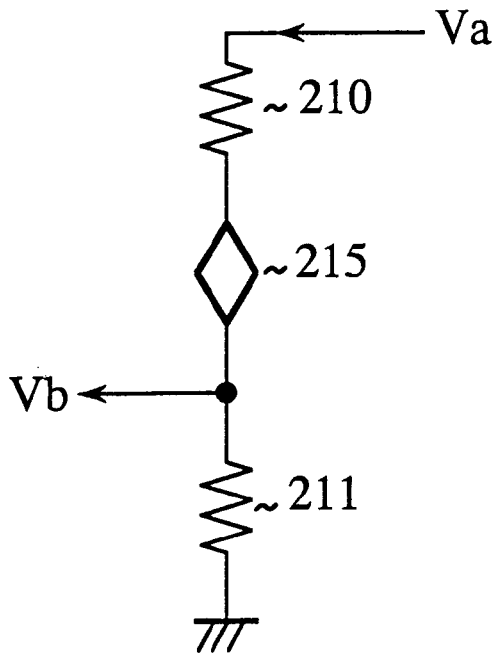
FIGS. 8A–8C are circuit diagrams each showing a voltage step-down circuit in an embodiment 6 of the flash memory embedded microcomputer in accordance with the present invention.
Figure 8B:
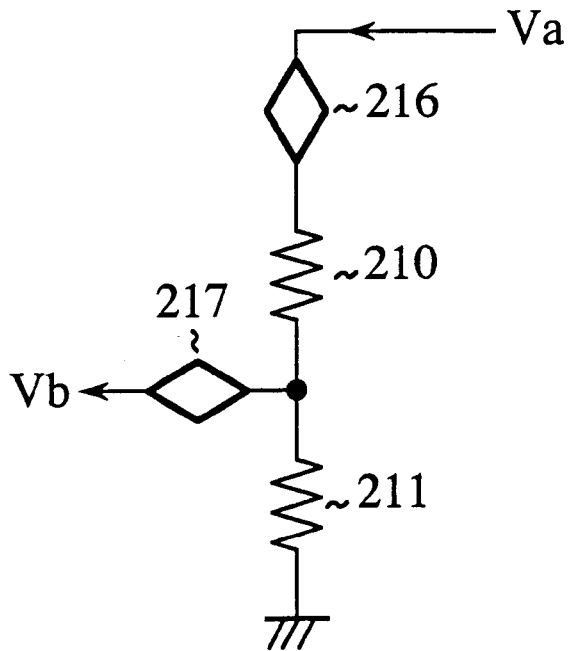

FIGS. 8A–8B are circuit diagrams each showing a voltage divider for linearly stepping down the voltages to be measured, in which a voltage such as VAMP applied to an input terminal Va is divided by resistors 210 and 211, and is output from an output terminal Vb. The voltage divider can be arranged as shown in FIGS. 8A–8C depending on transmission gates 215, 216, 217, 218 and 219 as an interruptible voltage transfer means.

If the ratio of the resistors 210 and 211 is set at 1:1, the voltage output from the output terminal Vb is half the voltage applied to the input terminal Va. Thus, measuring the voltage at the output terminal Vb by the A/D converter 5 results in half the voltage at the input terminal Va.

Figure 8C:
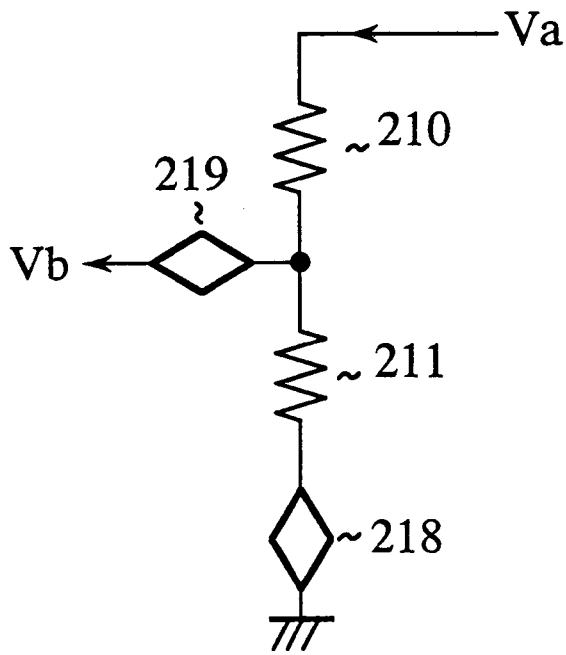

The circuits as shown in FIGS. 8A–8C can replace the transmission gates 50, 51 and 52. Alternatively, they can be juxtaposed with the transmission gates 50, 51 and 52 so that the voltages to be measured are transferred to the input terminal of the transmission gate 8n through the circuits as shown in FIGS. 8A–8C when they exceed 5.0 V as in the program verification mode, and through the transmission gates 50, 51 and 52 when they are equal to or less than 5.0 V as in the erasure verification mode. In this case, the transmission gates 215, 216, 217, 218 and 219 are controlled by the CPU 2.

The resistors 210 and 211 can be replaced by two capacitors connected in series so that the voltages divided by the capacitors are measured. This enables the transmission gates 215–219 to be removed because the direct current does not flow through the capacitors.

Thus, the present embodiment 6 has an advantage of utilizing the existing A/D converter 5 without redesigning it to measure the voltages exceeding $V_{cc}$ (=5.0 V).

Embodiment 7

Although the A/D converter 5 is started when a certain time period has elapsed after the CPU writes a command to the flash command register 22 in the foregoing embodiment 1–5, it can be started by the flash memory controller 18.

Figure 9:
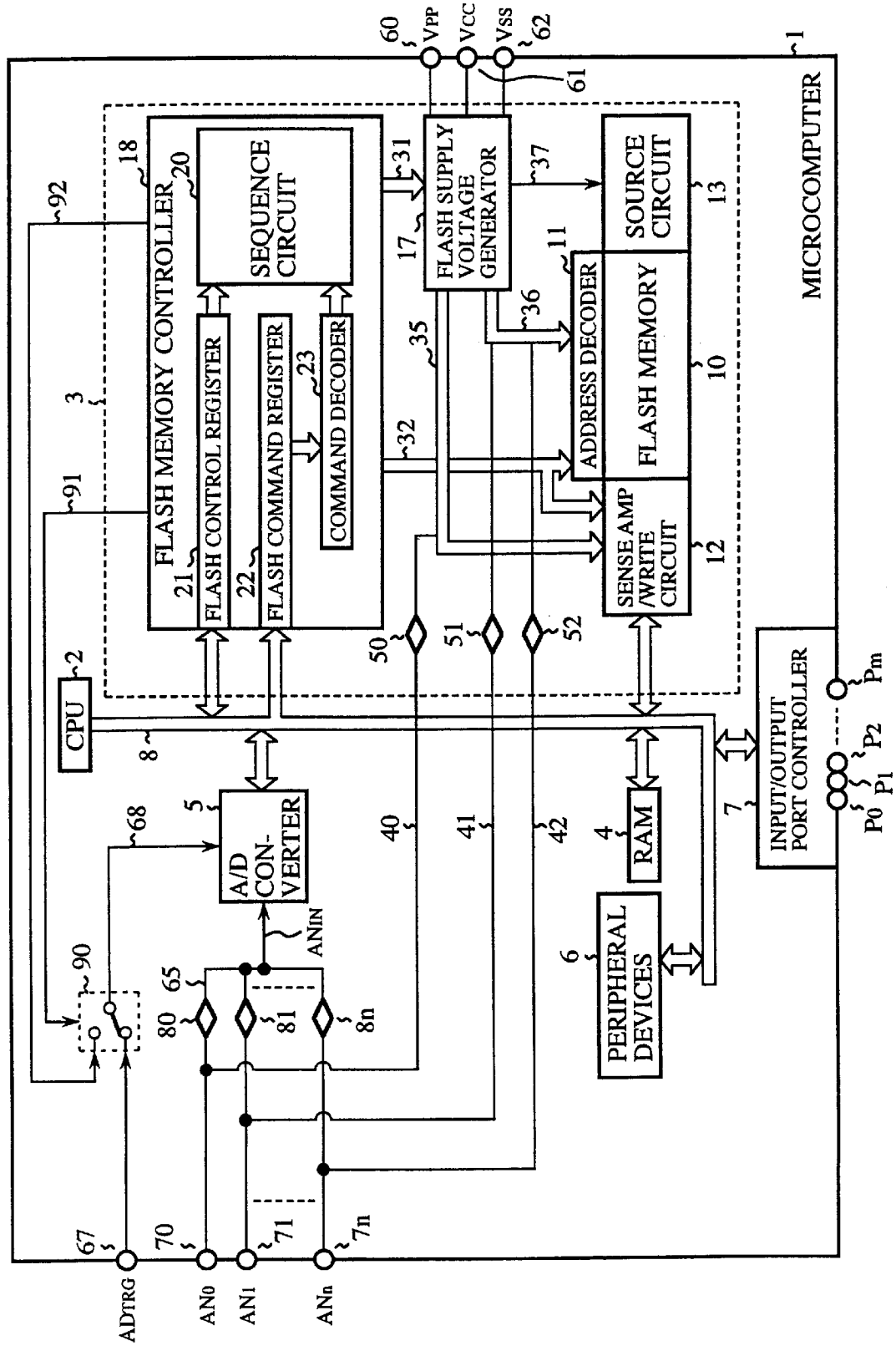
FIG. 9 is a block diagram showing a configuration of an embodiment 7 of the flash memory embedded microcomputer in accordance with the present invention.

FIG. 9 is a block diagram showing an embodiment 7 of the flash memory embedded microcomputer in accordance with the present invention, which applies the above-mentioned idea. In FIG. 9, the reference numeral 90 designates a switch for selecting, in response to the control signal fed from the flash memory controller 18 through a signal line 91, either an input signal fed from a regular external input port 67 ($AD_{TRG}$) or a trigger signal fed from the flash memory controller 18 through a signal line 92, as an external trigger input 68 to the A/D converter 5. The A/D converter 5 employs an external trigger mode, in which it starts its A/D conversion by the trigger input 68.

The sequence circuit 20 in the flash memory controller 18 outputs the trigger signal after the voltages such as VAMP have been settled as part of the command execution sequence.

Before that, when at least one of the "measured voltage select bits" as shown in FIG. 2, or the "voltage measurement mode select bit" as shown in FIG. 6 is placed at "1", the flash memory controller 18 supplies the switch 90 with the control signal through the signal line 91 so that the switch 90 selects the trigger signal fed through the signal line 92. After completing the A/D conversion, the A/D converter 5 makes an interrupt request to the CPU 2 as in the embodiment 1.

According to the present embodiment 7, the CPU 2 has only to wait for the interrupt request after issuing the command. This offers an advantage of reducing an amount of effort involved in making software. This trigger technique is especially effective in the erasure or programming mode, in which the voltages are generated only during certain time periods in the sequence, because it is difficult for the CPU 2 to start the A/D conversion in synchronism with the generation of the voltages in such modes.

Embodiment 8

Figure 10:
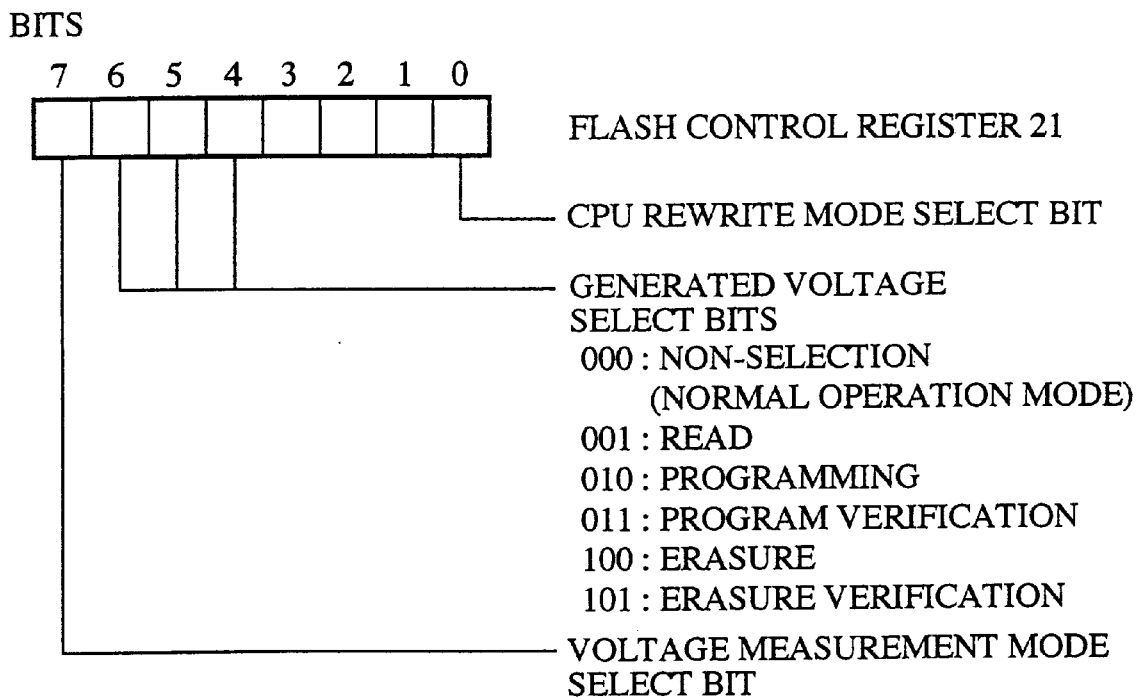
FIG. 10 is a diagram showing a structure of a flash control register in an embodiment 8 of the flash memory embedded microcomputer in accordance with the present invention.

Although the CPU 2 starts the sequence circuit 20 and flash supply voltage generator 17 by writing a command in the flash command register 22 to have the flash supply voltage generator 17 generate the voltages such as VAMP in the embodiment 1, the present embodiment 8 has, in the flash control register 21, generated voltage select bits corresponding to the command as shown in FIG. 10 so that the flash supply voltage generator 17 starts generating the voltages regardless of the command when the CPU 2 selects one of the select bits.

Thus, the present embodiment 8 continues generating, until clearing all the select bits, the voltages which are generated only in certain time periods in the normal command execution such as the programming or erasure mode in the foregoing embodiments. This offers an advantage of permitting less severe start timing of the A/D converter 5, allowing measurement with rough time settings.

Embodiment 9

In a microcomputer chip, various types of wiring (aluminum wiring, for example) run in all directions, and hence changes in the voltage levels on a particular wiring will induce noise in the wiring next to it owing to capacitance coupling between the wirings. Although such noise does not arise any particular problem as long as it occurs in the common digital values of 0 V or 5 V, it will results in degradation in A/D conversion accuracy if it occurs in wiring that transfers analog values such as flash supply voltages.

Figure 11:
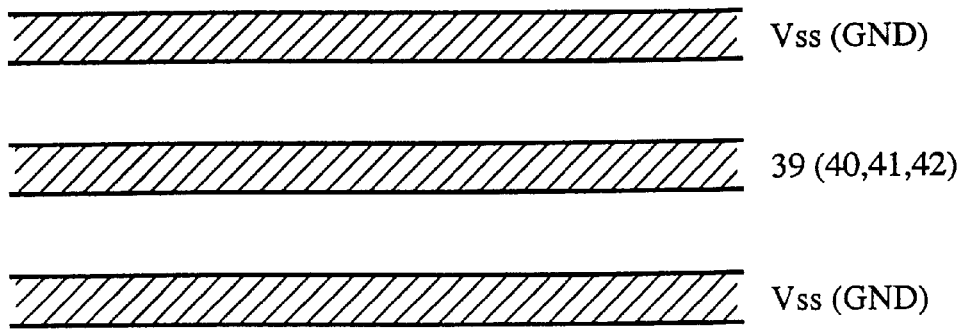
FIG. 11 is a diagram showing a layout pattern of voltage wiring in an embodiment 9 of the flash memory embedded microcomputer in accordance with the present invention.

FIG. 11 shows a layout pattern of wiring used in voltage measurement with a noise protective means carried out on the signal lines 39 shown in FIG. 1 and signal lines 40, 41 and 42 shown in FIG. 5. In FIG. 11, shadowed portions designate aluminum wirings, for example, in which wirings set at $V_{ss}$ (ground level 0 V) are provided at both sides of the wiring 39 (40, 41 or 42), thereby preventing, as much as possible, changes in other signal lines from affecting the wiring 39. The wirings at both sides can be set at $V_{cc}$ (=5 V).

The present embodiment 5 has an advantage of reducing the effect of noise from the adjacent signal lines, and of enabling the voltage measurement at high accuracy.

Embodiment 10

Although the foregoing embodiments 1–9 measure with the A/D converter 5 the voltages such as VAMP generated by the flash supply voltage generator 17, such voltages can be externally supplied by modifying part of the embodiment 4.

Figure 12:
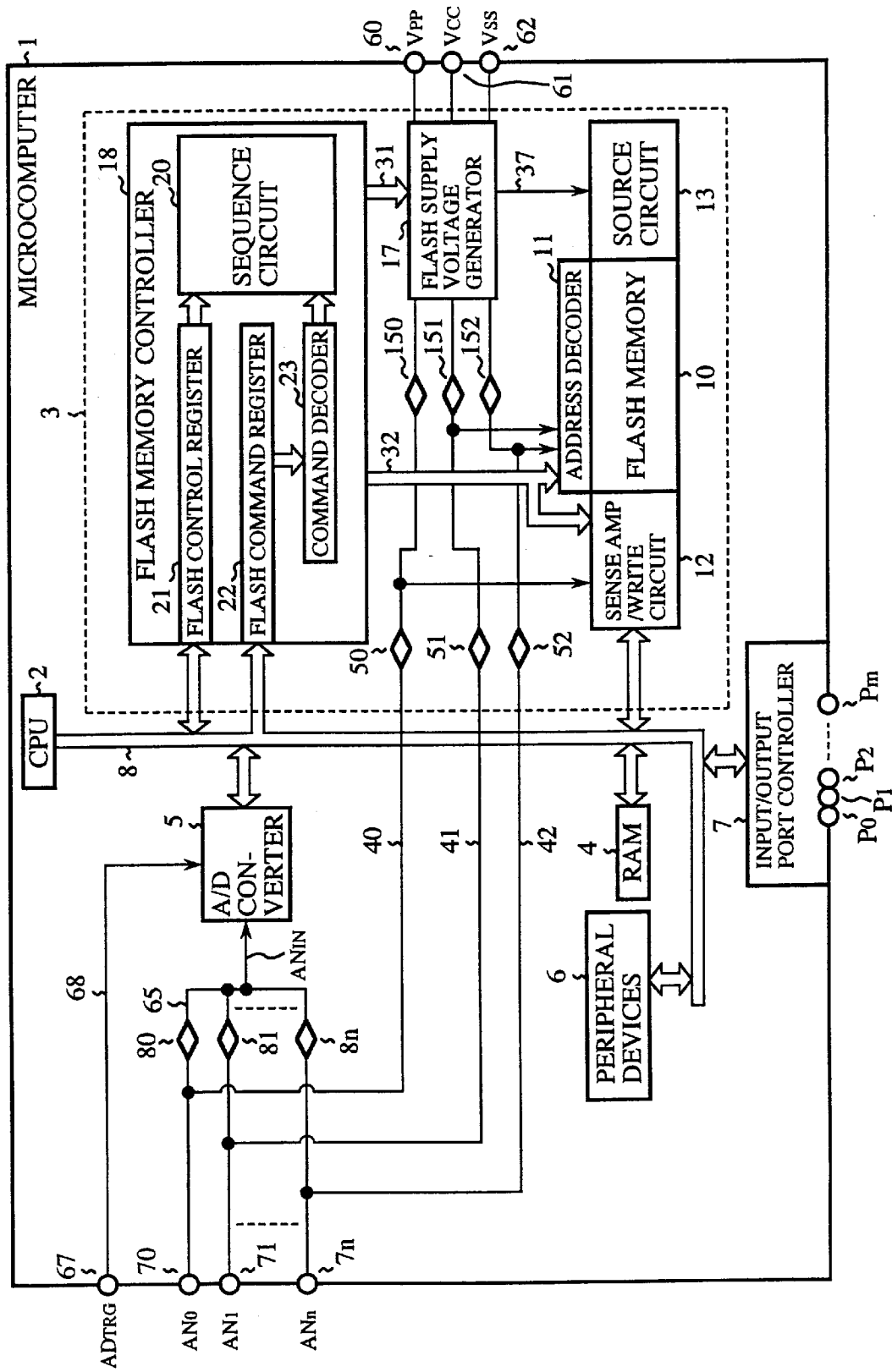
FIG. 12 is a block diagram showing a configuration of an embodiment 10 of the flash memory embedded microcomputer in accordance with the present invention.
Figure 13:
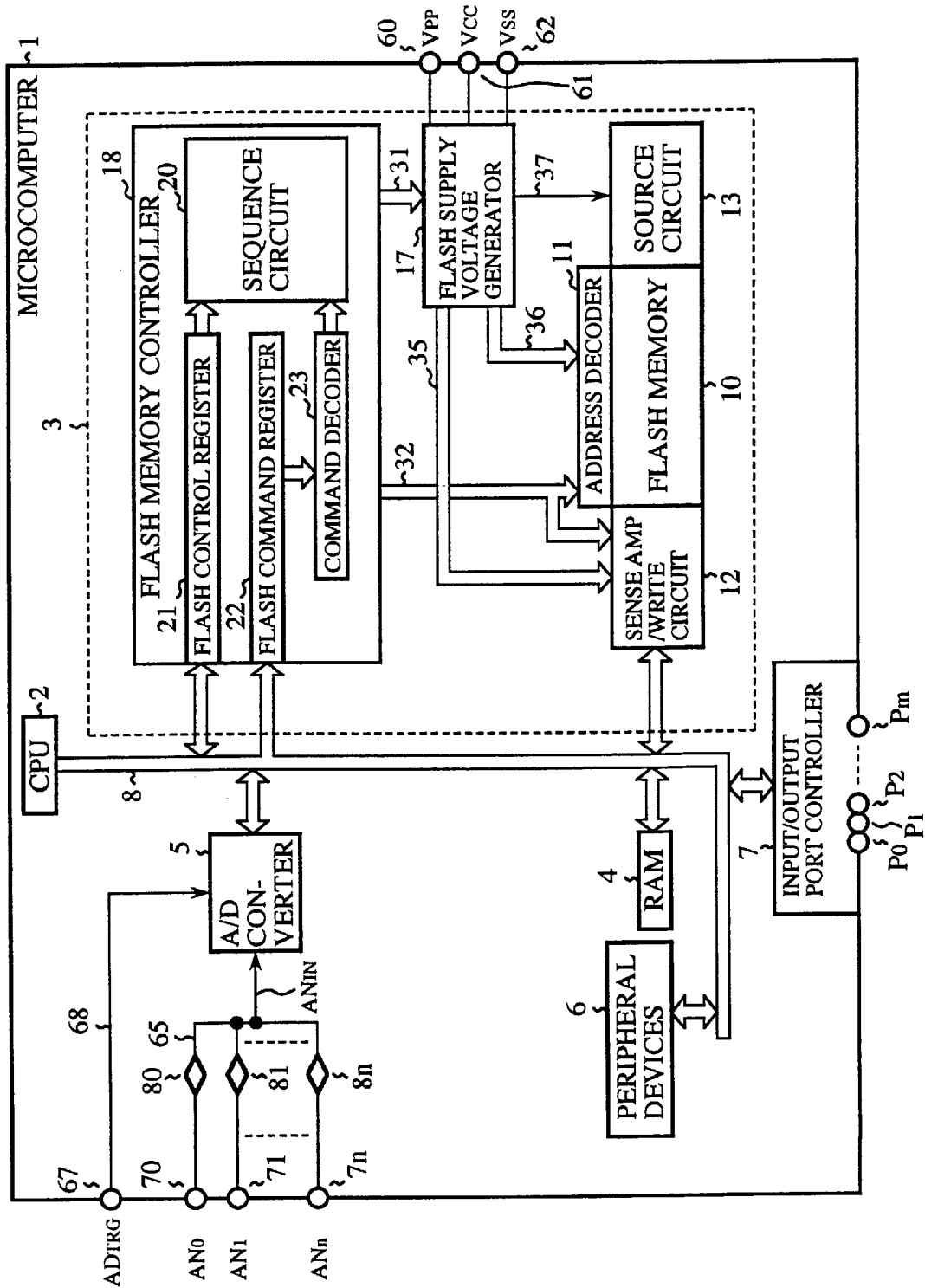
FIG. 13 is a block diagram showing a configuration of a conventional flash memory embedded microcomputer.

FIG. 12 is a block diagram showing an embodiment 10 of the flash memory embedded microcomputer in accordance with the present invention, in which the voltages are supplied from the outside. It differs from the configuration as shown in FIG. 5 in that transmission gates 150, 151 and 152 are interposed in the output lines of the flash supply voltage generator 17 as an interruptible fourth voltage transfer means. In FIG. 12, the supply voltage lines 35 and 36 as shown in FIG. 5 are removed for simplification. The transmission gates 150, 151 and 152 are controlled by the CPU 2.

The transmission gates 150, 151 and 152 are kept ON in the normal mode so that the normal operation is achieved involving the A/D conversion and measurement.

In contrast, when the transmission gates 150, 151 and 152 are brought into non-conducting state, and the transmission gates 50, 51 and 52 are brought into conducting state through select bits provided in the flash control register 21, it becomes possible to input through the input ports 70, 71 and 7n the voltages such as VAMP and VDEC to be supplied to the sense amplifier/write circuit 12 and address decoder 11. Considering that the transmission gates 150, 151 and 152 must transfer voltages exceeding $V_{cc}$ (=5.0 V), it is necessary for P-channel transistors 201 (see, FIG. 14) constituting these transmission gates to have their backgates connected to $V_{pp}$ (12 V), or the like.

As described above, according to the present embodiment 10, the supply voltages such as VAMP and VDEC can be supplied from the outside. This offers an advantage, in addition to those of the embodiment 1, that operation margins of the sense amplifier/write circuit 12 and address decoder 11 can be measured with the A/D converter 5 by executing the read, erasure verification and program verification with voltages around the designed values applied from the outside.

Figure 16:
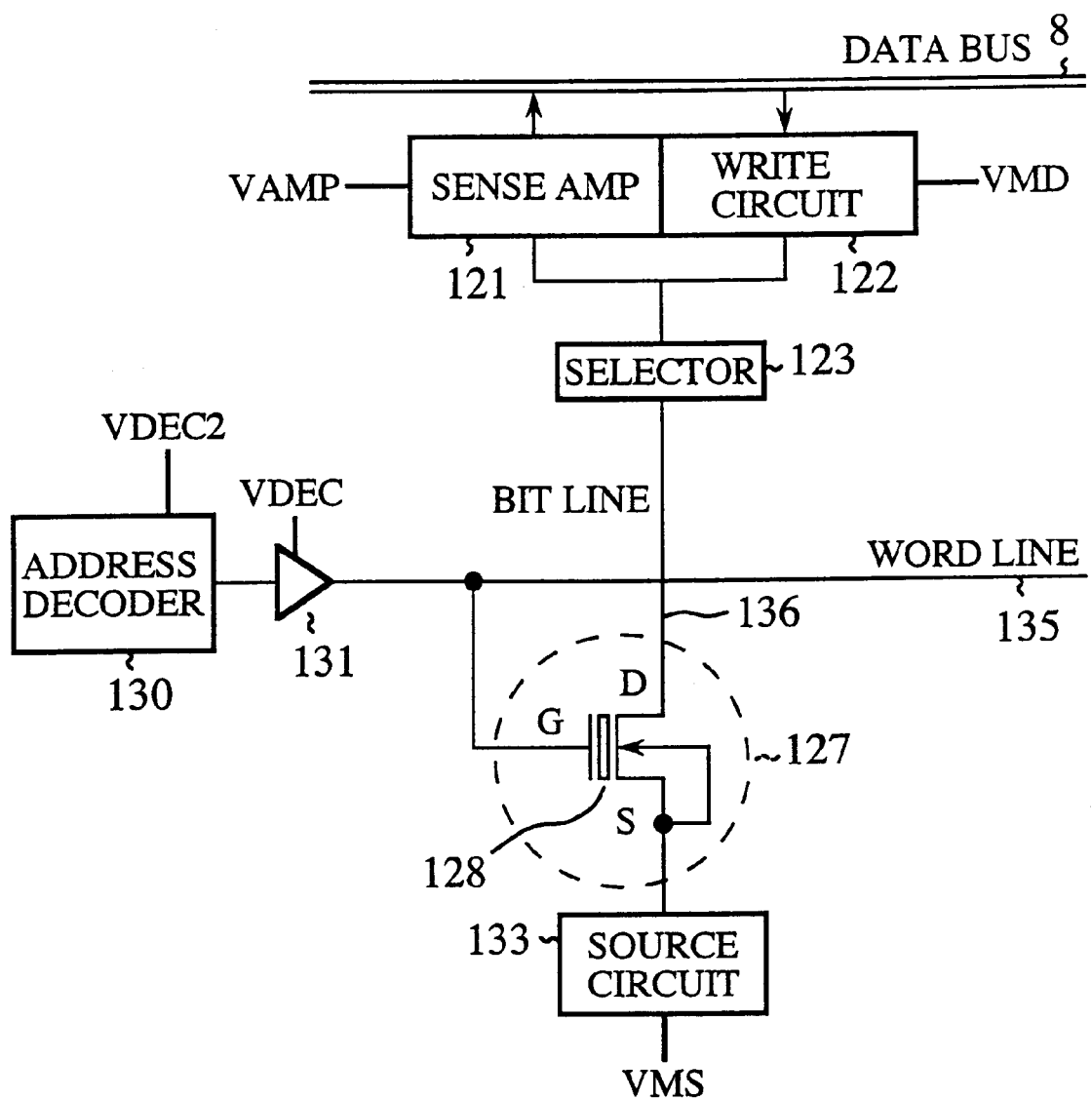
FIG. 16 is a block diagram showing a flash memory cell and its neighboring circuits.

Although the foregoing embodiments presumes the supply voltages VAMP, VDEC and VDEC2, it is also possible to measure the level of the supply voltage to the bit line 136 and that of the voltage VMS of the source circuit 133 as shown in FIG. 16.

What is claimed is:

1. A flash memory embedded microcomputer comprising:
   a flash memory;
   a flash supply voltage generator provided in said flash memory for generating supply voltages of said flash memory;
   flash memory power supply lines provided in said flash memory for conveying said supply voltages;
   an A/D converter for converting an input signal to the microcomputer into a digital signal;
   first voltage transfer means for interruptibly connecting one or more input ports of the microcomputer to an analog input terminal of said A/D converter;
   second voltage transfer means for interruptibly connecting each of said flash memory power supply lines to said analog input terminal of said A/D converter; and
   a CPU for bringing said first voltage transfer means into a conducting state and said second voltage transfer means into a nonconducting state in a normal operation mode, for bringing said first voltage transfer means into the nonconducting state and said second voltage transfer means into the conducting state in a voltage measurement mode of measuring voltages on said flash memory power supply lines, and for controlling reading of a conversion result of said A/D converter.

2. The flash memory embedded microcomputer as claimed in claim 1, wherein said second voltage transfer means has its output terminals commonly connected to an input terminal of said first voltage transfer means.

3. The flash memory embedded microcomputer as claimed in claim 1, further comprising third voltage transfer means, provided in a vicinity of said first voltage transfer means, for interruptibly connecting output terminals of said second voltage transfer means in common to an input terminal of said first voltage transfer means.

4. The flash memory embedded microcomputer as claimed in claim 1, further comprising third voltage transfer means, provided in a vicinity of said first voltage transfer means, for interruptibly connecting output terminals of said second voltage transfer means in common to said input terminal of said A/D converter.

5. The flash memory embedded microcomputer as claimed in claim 1, further comprising dedicated transmission lines for connecting each of output terminals of said second voltage transfer means to one of input terminals of said first voltage transfer means.

6. The flash memory embedded microcomputer as claimed in claim 1, wherein said second voltage transfer means are provided in a vicinity of said first voltage transfer means.

7. The flash memory embedded microcomputer as claimed in claim 1, wherein said second voltage transfer means comprises one or more voltage dividers for stepping down one or more voltages on said flash memory power supply lines.

8. The flash memory embedded microcomputer as claimed in claim 1, further comprising a selector for selecting one of trigger signals of said A/D converter fed from an external trigger input port and from a sequence circuit of a flash memory controller of said flash memory, wherein said selector selects the trigger signal fed from the external trigger input port in the normal mode, and the trigger signal fed from the sequence circuit in the voltage measurement mode, and supplies the selected trigger signal to said A/D converter.

9. The flash memory embedded microcomputer as claimed in claim 1, wherein said flash memory comprises a flash control register in a flash memory controller, and wherein said flash control register includes generated voltage select bits for selecting a voltage to be generated by said flash supply voltage generator.

10. The flash memory embedded microcomputer as claimed in claim 1, further comprising at least one pair of lines selected from a group consisting of a pair of ground lines and a pair of power supply lines, wherein said pair of lines is disposed at both sides of a line for supplying each output of said second voltage transfer means to said input terminal of said A/D converter.

11. The flash memory embedded microcomputer as claimed in claim 1, further comprising fourth voltage transfer means connected in series between said flash memory power supply lines and said second voltage transfer means for supplying said flash memory with voltages at connecting points of said second voltage transfer means and said fourth voltage transfer means.

12. The flash memory embedded microcomputer as claimed in claim 5, further comprising a selector for selecting one of trigger signals of said A/D converter fed from an external trigger input port and from a sequence circuit of a flash memory controller of said flash memory, wherein said selector selects the trigger signal fed from the external trigger input port in the normal mode, and the trigger signal fed from the sequence circuit in the voltage measurement mode, and supplies the selected trigger signal to said A/D converter.

13. The flash memory embedded microcomputer as claimed in claim 5, wherein said flash memory comprises a flash control register in a flash memory controller, and wherein said flash control register includes generated voltage select bits for selecting a voltage to be generated by said flash supply voltage generator.

14. The flash memory embedded microcomputer as claimed in claim 5, further comprising at least one pair of lines selected from a group consisting of a pair of ground lines and a pair of power supply lines, wherein said pair of lines is disposed at both sides of a line for supplying each output of said second voltage transfer means to said input terminal of said A/D converter.

15. The flash memory embedded microcomputer as claimed in claim 5, further comprising fourth voltage transfer means connected in series between said flash memory power supply lines and said second voltage transfer means for supplying said flash memory with voltages at connecting points of said second voltage transfer means and said fourth voltage transfer means.

* * * * *